United States Patent
Isono

(10) Patent No.: US 8,083,331 B2
(45) Date of Patent: Dec. 27, 2011

(54) PIEZOELECTRIC ACTUATOR, LIQUID EJECTION HEAD, AND METHOD FOR MANUFACTURING PIEZOELECTRIC ACTUATOR

(75) Inventor: Jun Isono, Nagoya (JP)

(73) Assignee: Brother Kogyo Kabushiki Kaisha, Aichi-ken (JP)

( * ) Notice: Subject to any disclaimer, the term of this patent is extended or adjusted under 35 U.S.C. 154(b) by 568 days.

(21) Appl. No.: 12/286,790

(22) Filed: Oct. 2, 2008

(65) Prior Publication Data
US 2009/0102894 A1    Apr. 23, 2009

(30) Foreign Application Priority Data
Oct. 4, 2007   (JP) ................................ 2007-260735

(51) Int. Cl.
B41J 2/045   (2006.01)
(52) U.S. Cl. ............... 347/72; 347/20; 347/40; 347/41; 347/47; 347/48; 347/68; 347/71
(58) Field of Classification Search ............ 347/20, 347/40–41, 47–48, 68, 71–72
See application file for complete search history.

(56) References Cited

U.S. PATENT DOCUMENTS

| | | | | |
|---|---|---|---|---|
| 6,276,781 B1 * | 8/2001 | Hasegawa | | 347/50 |
| 6,595,628 B2 * | 7/2003 | Takagi et al. | | 347/72 |
| 6,648,455 B2 * | 11/2003 | Takagi | | 347/71 |
| 6,672,715 B2 * | 1/2004 | Isono et al. | | 347/71 |
| 6,695,439 B2 * | 2/2004 | Takahashi | | 347/72 |
| 6,715,862 B2 * | 4/2004 | Takagi et al. | | 347/72 |
| 6,719,412 B2 * | 4/2004 | Isono | | 347/72 |
| 6,739,704 B2 * | 5/2004 | Takahashi | | 347/72 |
| 6,846,069 B2 * | 1/2005 | Ito et al. | | 347/71 |
| 6,964,472 B2 * | 11/2005 | Takagi et al. | | 347/72 |
| 6,979,078 B2 * | 12/2005 | Ito et al. | | 347/71 |
| 7,073,895 B2 * | 7/2006 | Ito | | 347/72 |
| 7,163,280 B2 * | 1/2007 | Watanabe | | 347/68 |
| 7,219,428 B2 * | 5/2007 | Ito | | 29/890.1 |
| 7,284,841 B2 * | 10/2007 | Imai et al. | | 347/71 |
| 7,290,336 B2 * | 11/2007 | Buhler et al. | | 29/890.1 |
| 7,294,952 B2 | 11/2007 | Ito | | |
| 7,360,870 B2 * | 4/2008 | Goto et al. | | 347/47 |
| 7,401,905 B2 * | 7/2008 | Ito et al. | | 347/68 |
| 7,416,279 B2 * | 8/2008 | Isono | | 347/50 |
| 7,434,918 B2 * | 10/2008 | Sugahara | | 347/71 |

(Continued)

FOREIGN PATENT DOCUMENTS

JP   2005-322850   11/2005

Primary Examiner — Ryan Lepisto
Assistant Examiner — Guy Anderson
(74) Attorney, Agent, or Firm — Frommer Lawrence & Haug LLP

(57) ABSTRACT

A piezoelectric actuator includes piezoelectric layers. Individual electrodes are formed on an outermost piezoelectric layer and arranged in a row extending along a first direction. Through holes are formed in the outermost piezoelectric layer and arranged substantially in a row extending in the first direction to contact with first end portions of the individual electrodes. The individual electrodes include at least one first individual electrode and at least one second individual electrode. The first individual electrode comprises a first electrode terminal provided at the first end portion, and the second individual electrode comprises a second electrode terminal provided at a second end portion opposite to the first end portion with respect to a second direction perpendicular to the first direction. The second individual electrode has a thickened portion extending from the second electrode terminal towards the first end portion.

8 Claims, 6 Drawing Sheets

U.S. PATENT DOCUMENTS

| | | | |
|---|---|---|---|
| 7,513,609 B2 * | 4/2009 | Katayama | 347/68 |
| 7,514,855 B2 * | 4/2009 | Isono | 310/366 |
| 7,517,065 B2 * | 4/2009 | Isono | 347/71 |
| 7,568,783 B2 * | 8/2009 | Katayama | 347/42 |
| 2005/0162484 A1 * | 7/2005 | Isono | 347/68 |
| 2005/0248628 A1 * | 11/2005 | Isono | 347/71 |

* cited by examiner

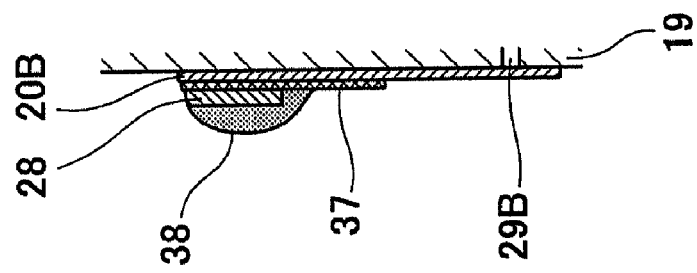
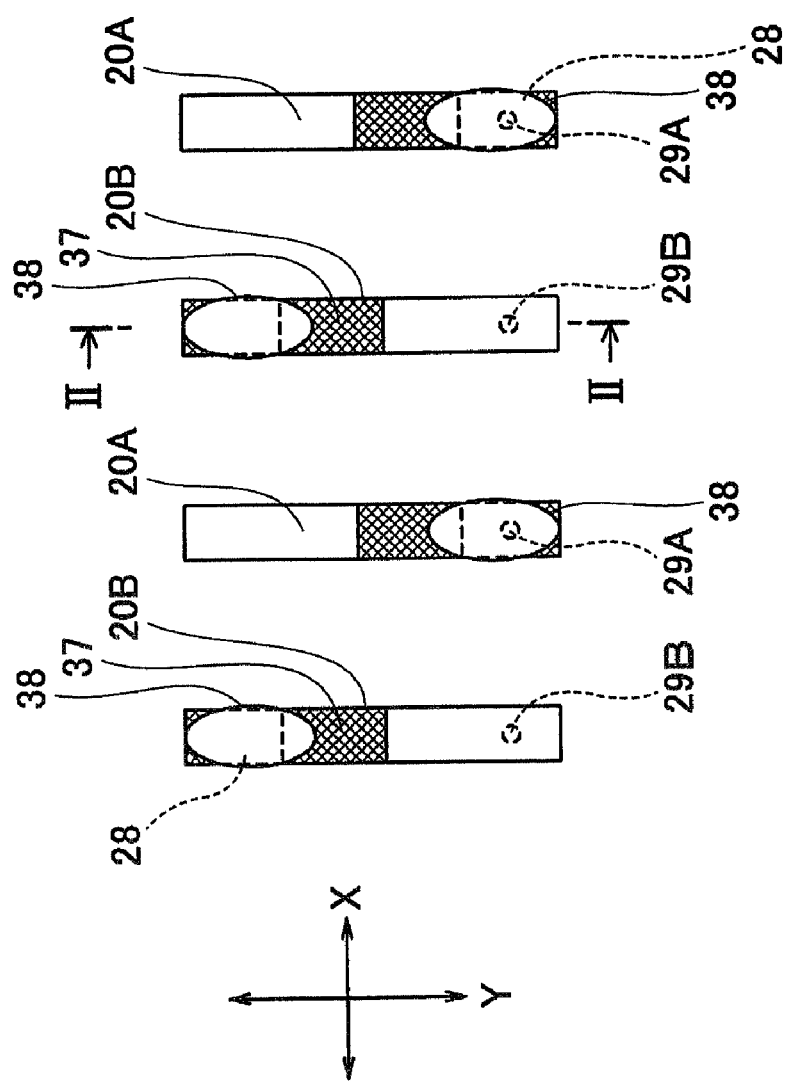

PIEZOELECTRIC ACTUATOR, LIQUID EJECTION HEAD, AND METHOD FOR MANUFACTURING PIEZOELECTRIC ACTUATOR

CROSS-REFERENCE TO RELATED APPLICATIONS

This application is based upon and claims priority from Japanese Patent Application No. 2007-260735 filed on Oct. 4, 2007, the entire contents of which are incorporated herein by reference.

TECHNICAL FIELD

The present invention relates to a piezoelectric actuator, a liquid ejection head, and method for manufacturing the piezoelectric actuator.

BACKGROUND

An ink jet recording head configured to convey ink supplied from an ink tank and jets ink droplets from nozzles to a recording sheet has been used as one example of a liquid ejection head. The ink jet system is classified according to differences in the method of generation of jetting energy. The ink jet system includes a piezoelectric system for jetting ink droplets by utilizing vibration forces of piezoelectric elements and a thermal jet system that jets ink droplets by generation of air bubbles based on thermal energy.

For example, an ink jet recording head of a piezoelectric system, which is disclosed in JP-A-2005-322850, includes: a cavity unit having a plurality of pressure chambers provided corresponding to respective nozzles in an ink flow path from a common liquid chamber connected to ink supply ports to a plurality of nozzle ports; and a piezoelectric actuator attached to the cavity unit and configured to apply an ejection pressure to ink in the pressure chamber by selectively varying the cubic capacity of the pressure chamber. The piezoelectric actuator includes a common electrode and a plurality of individual electrodes alternately intervene between a plurality of piezoelectric layers, and the piezoelectric actuator is bonded to a wiring member to electrically connect the corresponding common electrode and the corresponding individual electrodes to an external device.

SUMMARY

The piezoelectric actuator described in JP-A-2005-322850 has a nine-layered structure in which a piezoelectric layer having individual electrodes formed thereon and a piezoelectric layer having a common electrode formed thereon are laminated alternately by six layers on a bottom layer, and an adjustment layer (restriction layer) having a relay electrode formed thereon and a top layer are laminated. In order to reduce the manufacturing cost of the piezoelectric actuator, it is considered that the number of a piezoelectric sheets is reduced. However, it is impossible to eliminate a piezoelectric layer necessary to apply an ejection pressure, a bottom layer overlaid on the cavity unit to form a pressure chamber, and a top layer on which a surface electrode is provided for a connection with the wiring member. Therefore, an eight-layered structure may be considered by eliminating the adjustment layer laminated on the rear side of the top layer. On the other hand, since a plurality of drive side terminal electrodes (bump electrodes for connection of individual electrodes in JP-A-2005-322850) to which signal lines of wiring members are connected are provided at a high density in a restricted wiring spacing, and it is necessary that wires passing through the respective terminal electrodes are taken out from the respective terminal electrodes, a plurality of terminal electrodes widen the distance between respective electrodes and enable wiring formation by disposing the terminal electrodes in a staggered pattern. Therefore, as shown in FIG. 7, individual electrode terminals 50 (bonding terminals for individual electrodes of JP-A-2005-322850) is formed on the surface individual electrodes 55 of the uppermost piezoelectric layer (top layer) such that the individual electrode terminals 50 are disposed in a row direction to form a staggered pattern. In addition, surface layer through holes 51 are positioned immediately below the individual electrode terminals 50 to allow electrical connections with the individual electrodes of the piezoelectric layer. Further, in the piezoelectric layer laminated on the rear side of the adjustment layer, individual electrode through holes 52 are disposed in a row along the row direction. That is, the adjustment layer relays the surface layer through holes 51A of one row side of the surface layer through holes 51 disposed in a staggered pattern to the row side of the other surface layer through holes 51B, that is, the row side of the individual electrode through holes 52 by means of a relay electrode 53 formed on an upper surface of the adjustment layer.

Accordingly, in order to eliminate the adjustment layer, for example, it is considered that, as shown by hypothetical lines in FIG. 7, the surface layer through holes 54 are disposed in a row along the row direction, and the electrode terminals 50 are electrically connected to the surface layer through holes by means of the surface individual electrodes 55. However, when the drive side terminal electrodes are bonded to the electrode terminals 50 by soldering, solder comes out between the drive side terminal electrodes and the electrode terminals 50 and spreads on the surface individual electrodes 55. Since the surface individual electrodes 55 are formed of a silver-based material that is typical as the conductive material, disconnected wiring 56 may occur due to a so-called silver corrosion crack by which silver of the surface individual electrodes 55 spreads in the solder due to a melting action of the spread solder. Therefore, by disposing the through holes immediately below the electrode terminals 50 on the surface individual electrodes 55, the surface individual electrodes 55 are protected to enable conductivity. Accordingly, it is requisite that the through holes are disposed immediately below the electrode terminals 50 arranged in a staggered pattern, which absolutely necessitate the adjustment layer. Therefore, it was impossible that the manufacturing costs could be reduced by making the piezoelectric actuator into an eight-layered structure.

One aspect of the present invention is conceived in view of the above-described circumstances and has an object to provide a piezoelectric actuator for which manufacturing costs can be reduced by decreasing the number of lamination layers, a liquid ejection head using the piezoelectric actuator, and a method for manufacturing the piezoelectric actuator.

According to an aspect of the invention, there is provided a piezoelectric actuator comprising: an uppermost piezoelectric layer comprising a plurality of surface individual electrodes provided on a front surface in a row that extends along a first direction, and the uppermost piezoelectric layer being connectable to a wiring member comprising a plurality of drive side terminal electrodes such that the surface individual electrodes are respectively connected to the drive side terminal electrodes; a plurality of piezoelectric layers that are laminated and provided on a rear surface side of the uppermost piezoelectric layer; and a plurality of internal electrodes disposed between the piezoelectric layers, wherein each of the surface individual electrodes has a slender shape of which a longitudinal direction extends along a second direction perpendicular to the first direction, wherein a plurality of surface layer through holes are formed in the uppermost piezoelectric layer such that the surface individual electrodes are connected to the internal electrodes via the surface layer through holes; wherein an electrode terminal smaller than a dimension with respect to the longitudinal direction of the respective surface individual electrodes is formed on each of the surface individual electrodes, wherein the plurality of electrode terminals are disposed along the first direction to be staggered and are connectable to the respective drive side terminal electrodes through a thermo-fusing conductive bonding material, wherein the surface layer through holes are disposed substantially in a row that extends along the first direction, and wherein at least one of the plurality of surface individual electrodes has a thickened portion extending from the electrode terminal towards the surface layer through hole.

According to another aspect of the invention, there is provided a liquid ejection head comprising: a cavity unit comprising nozzles arranged in a row and a plurality of pressure chambers arranged in a row corresponding to the respective nozzles; and a piezoelectric actuator attached to the cavity unit such that activation portions correspond to the respective pressure chambers; wherein the piezoelectric actuator comprises: an uppermost piezoelectric layer comprising a plurality of surface individual electrodes provided on a front surface in a row that extends along a first direction, and the uppermost piezoelectric layer being connectable to a wiring member comprising a plurality of drive side terminal electrodes such that the surface individual electrodes are respectively connected to the drive side terminal electrodes; a plurality of piezoelectric layers that are laminated and provided on a rear surface side of the uppermost piezoelectric layer; and a plurality of internal electrodes disposed between the piezoelectric layers, wherein each of the surface individual electrodes has a slender shape of which a longitudinal direction extends along a second direction perpendicular to the first direction, wherein a plurality of surface layer through holes are formed in the uppermost piezoelectric layer such that the surface individual electrodes are connected to the internal electrodes via the surface layer through holes; wherein an electrode terminal smaller than a dimension with respect to the longitudinal direction of the respective surface individual electrodes is formed in one end portion of each of the surface individual electrodes, wherein the plurality of electrode terminals are disposed along the first direction to be staggered and are connectable to the respective drive side terminal electrodes through a thermo-fusing conductive bonding material, wherein the surface layer through holes are disposed substantially in a row that extends along the first direction, and wherein at least one of the plurality of surface individual electrodes has a thickened portion extending from the electrode terminal towards the surface layer through hole.

According to still another aspect of the invention, there is provided a method for manufacturing a piezoelectric actuator comprising: an uppermost piezoelectric layer comprising a plurality of surface individual electrodes provided on a front surface in a row that extends along a first direction, and the uppermost piezoelectric layer being connectable to a wiring member comprising a plurality of drive side terminal electrodes such that the surface individual electrodes are respectively connected to the drive side terminal electrodes; a plurality of piezoelectric layers that are laminated and provided on a rear surface side of the uppermost piezoelectric layer; and a plurality of internal electrodes disposed between the piezoelectric layers, wherein said method comprising: forming a plurality of surface layer through holes in the uppermost piezoelectric layer to be arranged substantially in a row extending along the first direction, such that the surface individual electrodes are connected to the internal electrodes via the surface layer through holes; forming the individual electrodes on the uppermost piezoelectric layer such that the surface individual electrodes has a slender shape of which a longitudinal direction extends along a second direction perpendicular to the first direction; applying a conductive paste on the surface individual electrodes to form electrode terminals smaller than a dimension with respect to the longitudinal direction of the respective surface individual electrodes, such that the plurality of electrode terminals are disposed along the first direction to be staggered and are connectable to the respective drive side terminal electrodes through a bonding material made of the conductive paste; applying a conductive paste again on at least a part of the individual electrodes to form a thickened portion extending from the electrode terminal towards the surface layer through hole.

According to still another aspect of the invention, there is provided a piezoelectric actuator comprising: a plurality of piezoelectric layers laminated in a lamination direction, the piezoelectric layers comprising an outermost piezoelectric layer disposed at an outermost of the piezoelectric layers with respect to the lamination direction, and the outermost piezoelectric layer having a first surface and a second surface that is opposite to the first surface and faces another piezoelectric layer; and a plurality of individual electrodes formed on the first surface of the outermost piezoelectric layer and arranged in a row extending along a first direction, each of the plurality of individual electrodes having a first end portion and a second end portion opposite to the first end portion with respect to a second direction perpendicular to the first direction, wherein a plurality of through holes are formed in the outermost piezoelectric layer and arranged substantially in a row extending in the first direction, and the through holes respectively contact with the first end portions of the individual electrodes, wherein the individual electrodes comprise at least one first individual electrode and at least one second individual electrode, the first individual electrode comprises a first electrode terminal provided at the first end portion, and the second individual electrode comprises a second electrode terminal provided at the second end portion, and wherein the second individual electrode has a thickened portion extending from the second electrode terminal towards the first end portion.

BRIEF DESCRIPTION OF THE DRAWINGS

FIG. 5A is a plan view of surface individual electrodes aligned in the row direction, and FIG. 5B is a cross-sectional view taken along the line II-II of FIG. 5A;

DESCRIPTION

Figure 1:
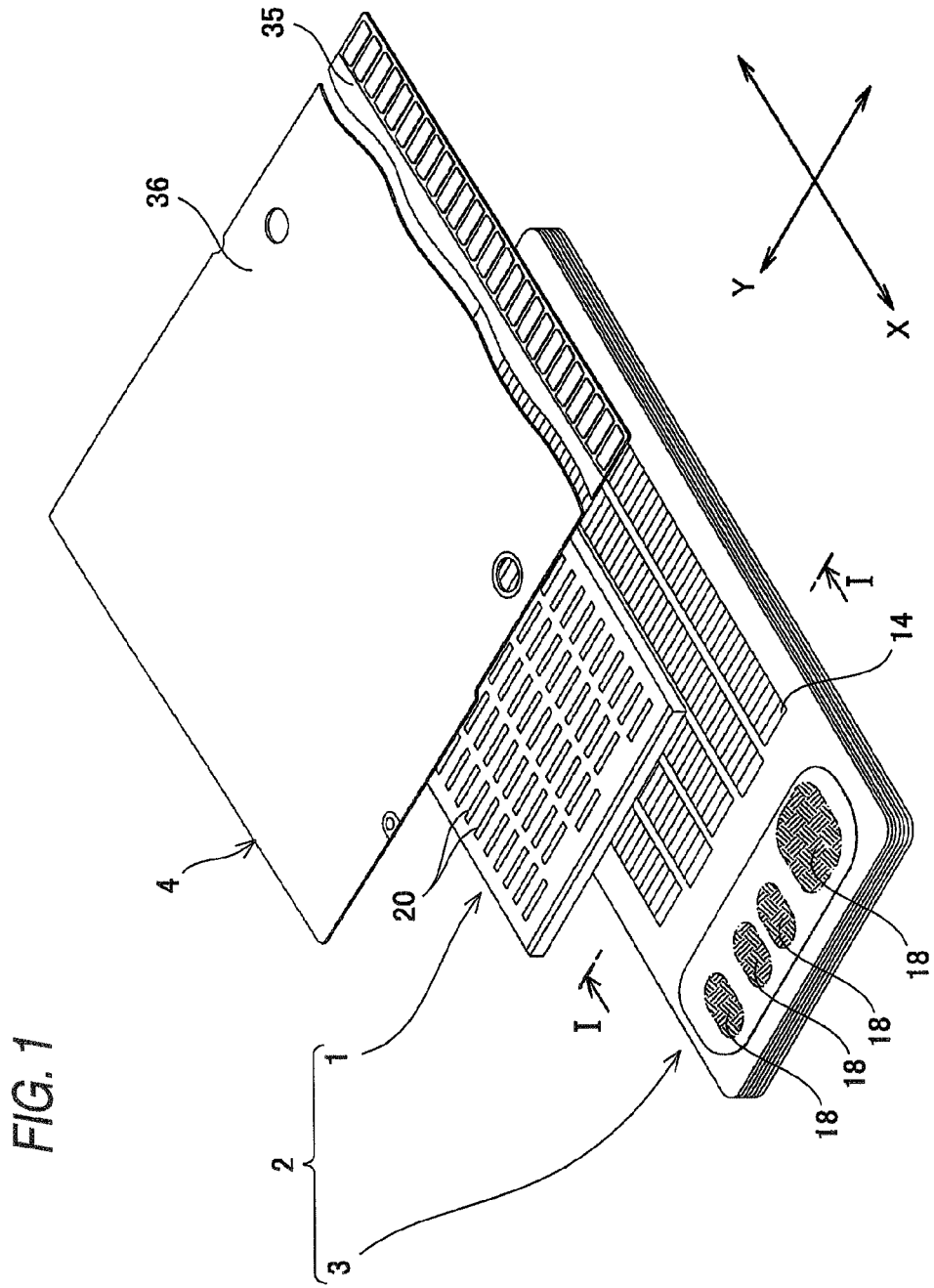
FIG. 1 is a perspective view showing the entirety of an ink jet recording head equipped with a piezoelectric actuator according to an illustrative aspect of the present invention.

Hereinafter, illustrative aspects of the invention will be described with reference to the drawings. FIG. 1 is a disassembled perspective view of an ink jet recording head 2 that is one example of a liquid ejection head in which a piezoelectric actuator 1 according to an illustrative aspect of the present invention is used. The ink jet recording head 2 (liquid ejection head) mainly includes a cavity unit 3 in which a plurality of substantially rectangular plates are laminated and a piezoelectric actuator 1 attached to the cavity unit 3. A wiring member 4 (flexible flat cable), in which a drive circuit for outputting drive power to the piezoelectric actuator 1 is mounted, is bonded to the upper surface of the piezoelectric actuator 1. In the following description, as shown by the arrow in FIG. 1, the lengthwise direction of the cavity unit 3 is regarded as the X-axis direction (row direction), and the crosswise direction is regarded as the Y-axis direction (the lateral row direction).

The ink jet recording head 2 is provided in an ink jet printer (not shown) for performing recording and printing on a recording medium such as recording sheets by an ink jet system. A carriage configured to reciprocate in a predetermined scanning direction (the Y-axis direction in FIG. 1) is provided in the ink jet printer, and the ink jet recording head 2 is mounted on the carriage. The ink jet recording head 2 ejects ink toward the recording medium while reciprocating along with the carriage in the scanning direction, which performs recording on the recording medium.

Figure 2:
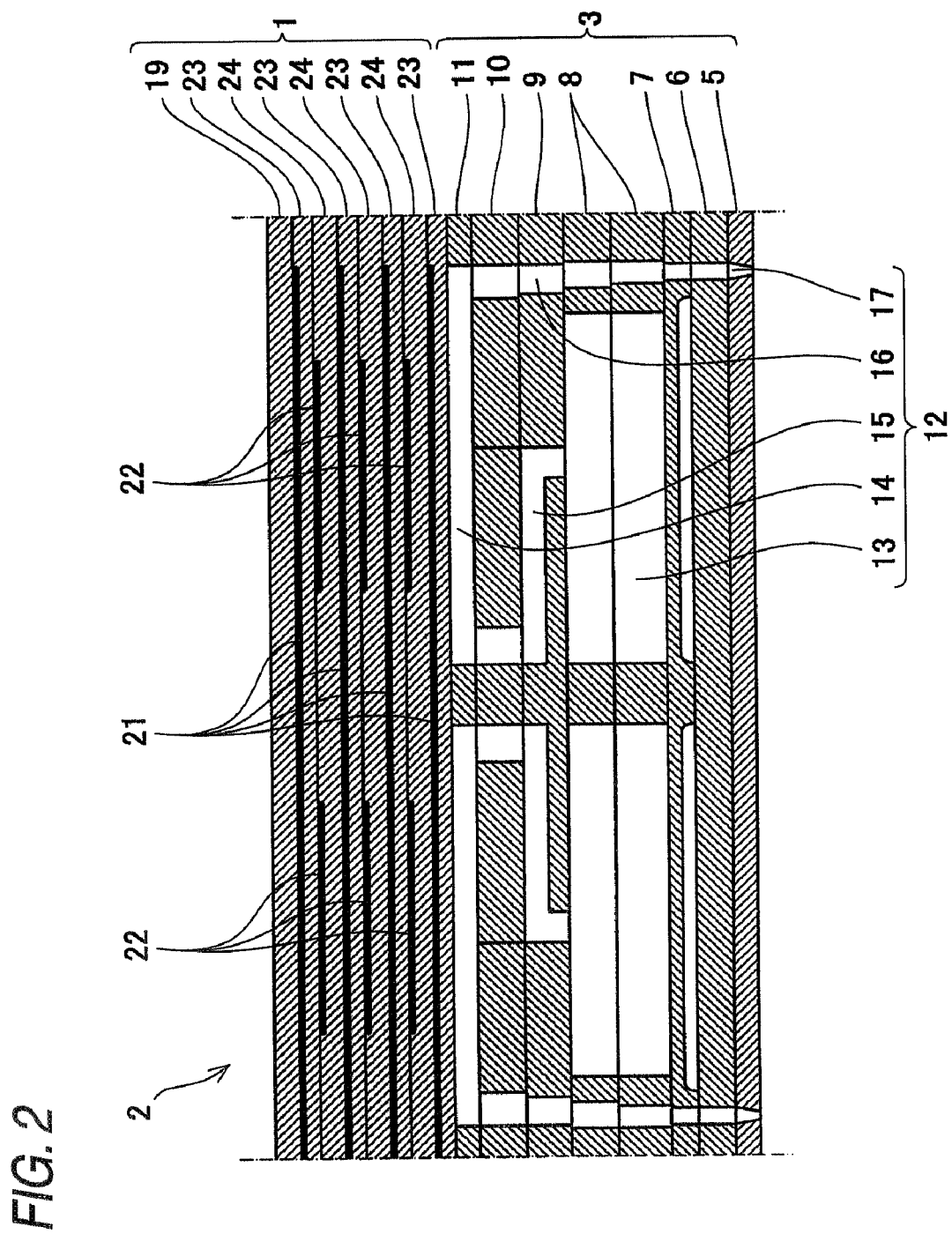
FIG. 2 is a cross-sectional view taken along the line I-I of FIG. 1.

FIG. 2 is a cross-sectional view taken along the line I-I, which shows the ink jet recording head 2. The cavity unit 3 formed by laminating and adhering, in order, a nozzle plate 5, a spacer plate 6, a damper plate 7, a manifold plate 8, a supply plate 9, a base plate 10 and a cavity plate 11. The plates 5 to 11 have a substantially rectangle of the same dimensions in a plan view.

The nozzle plate 5 is molded with a synthetic resin such as polyamide, etc., and the other plates 6 through 11 are molded with a 42% nickel alloy. The plates 5 through 11 are rectangular in the plan view and have a thickness of 50 through 150 μm. The respective plates 5 through 11 have openings and grooves formed by electrolytic etching, laser processing, or plasma jet processing. In the lowermost layer nozzle plate 5 of the cavity unit 3, a number of nozzle openings 17 for ejecting ink droplets, the diameters of which are very minute, are opened at minute intervals, and the nozzle openings 17 are disposed substantially in a row extending along the lengthwise direction (the X-axis direction in FIG. 1) of the nozzle plate 5, and five rows of nozzles are arranged in the lateral row direction (the Y-axis direction). In the pressure chamber plate 11 located at the uppermost layer in the cavity unit 3, a plurality of pressure chamber openings that respectively define a plurality of pressure chambers 14 are formed to penetrate the pressure chamber plate 11 in the thickness direction, and five rows of the pressure openings are arranged in the lateral row direction (the Y-axis direction) in which each row or the pressure openings extends along the X-axis direction such that the pressure openings are located to correspond to the respective nozzle openings 17. Each of the pressure chamber openings (pressure chambers 14) is slender-shaped in a plan view such that the dimension in the lateral row direction (the Y-axis direction) is longer than the row direction (the X-axis direction), and each of the pressure chamber openings is disposed such that the lengthwise direction (the Y-axis direction) of the pressure chamber opening is along a direction orthogonal to the row of the nozzle openings 17. The plurality of pressure chamber openings define the pressure chambers 14 each having an internal spacing by laminating the piezoelectric actuators 1 from above and laminating the base plates 10 from below.

The base plate 10 through the spacer plate 6 have openings formed therein which define a communication flow path 16 that allows fluid communication between one end portion of the pressure chamber 14 and the respective nozzle opening 17. The base plate and the supply plate respectively have an opening and groove which define a flow path 15 that allows fluid communicating between the common ink chamber 13 and the other end portion of the pressure chamber 14.

The manifold plate 8 includes two plates that have common ink chamber openings formed to penetrate the plates in the thickness direction. The common ink chamber openings define the respective common ink chambers 13 extending along the row direction (the X-axis direction) at downward positions corresponding to the pressure chambers 14 disposed in the row direction (the X axis direction). In this embodiment, five rows of the common ink chambers 13 are provided in the lateral row direction (the Y-axis direction). The damper plate 7 is recessed to form concaves on a surface opposite to a surface facing the common ink chamber 13, and the thin portions formed by the concaves define. In this embodiment, five rows of the damper walls are arranged in the Y-axis direction, which corresponds to the shape of the common ink chambers 13. The supply plate 9, two manifold plates, damper plate 7 and spacer plate are laminated in this order, which forms the common ink chamber 13 and the damper spacing. The nozzle plates 5 having a plurality of nozzle openings 17 are laminated in and adhered to the spacer plate 6 from downward.

The lamination of the plates 5 through 11 connects the openings and grooves and forms a channel 12 through which ink is allowed to flow. The channel 12 serves as an ink flow path from the common ink chamber 13, which includes a flow path 15, a pressure chamber 14, a communication flow path 16 and a nozzle 17. Therefore, ink flowed in from an ink supply source (not shown) passes through the common ink chamber 13, the flow path 15, the pressure chamber 14, and the communication flow path 16 in this order, and is lead to the nozzle 17.

As shown in FIG. 1, the plates from the cavity plate through the manifold plate each has four openings to define four ink supply ports 18 corresponding to, for example, four types of ink (black, magenta, cyan and yellow) provided at one end portion of the plates with respect to the lengthwise direction. The openings of the plates for each of the ink supply ports 18 are formed at positions to allow communication with one another with respect to a vertical direction when the plates are laminated. Four types of inks are independently supplied from the respective ink supply sources (not illustrated) into the ink supply ports 18, respectively. One ink supply port 18 used for black ink which is used high frequency is made larger than the others and communicates with two of the four channels 12, and the other three ink supply ports 18 respectively communicate with the other three channels 12 independent from one another. Accordingly, the cavity unit 3 has five channels 12, and the ink jet recording head 2 is configured to eject four types of ink independently from one another.

Figure 3:
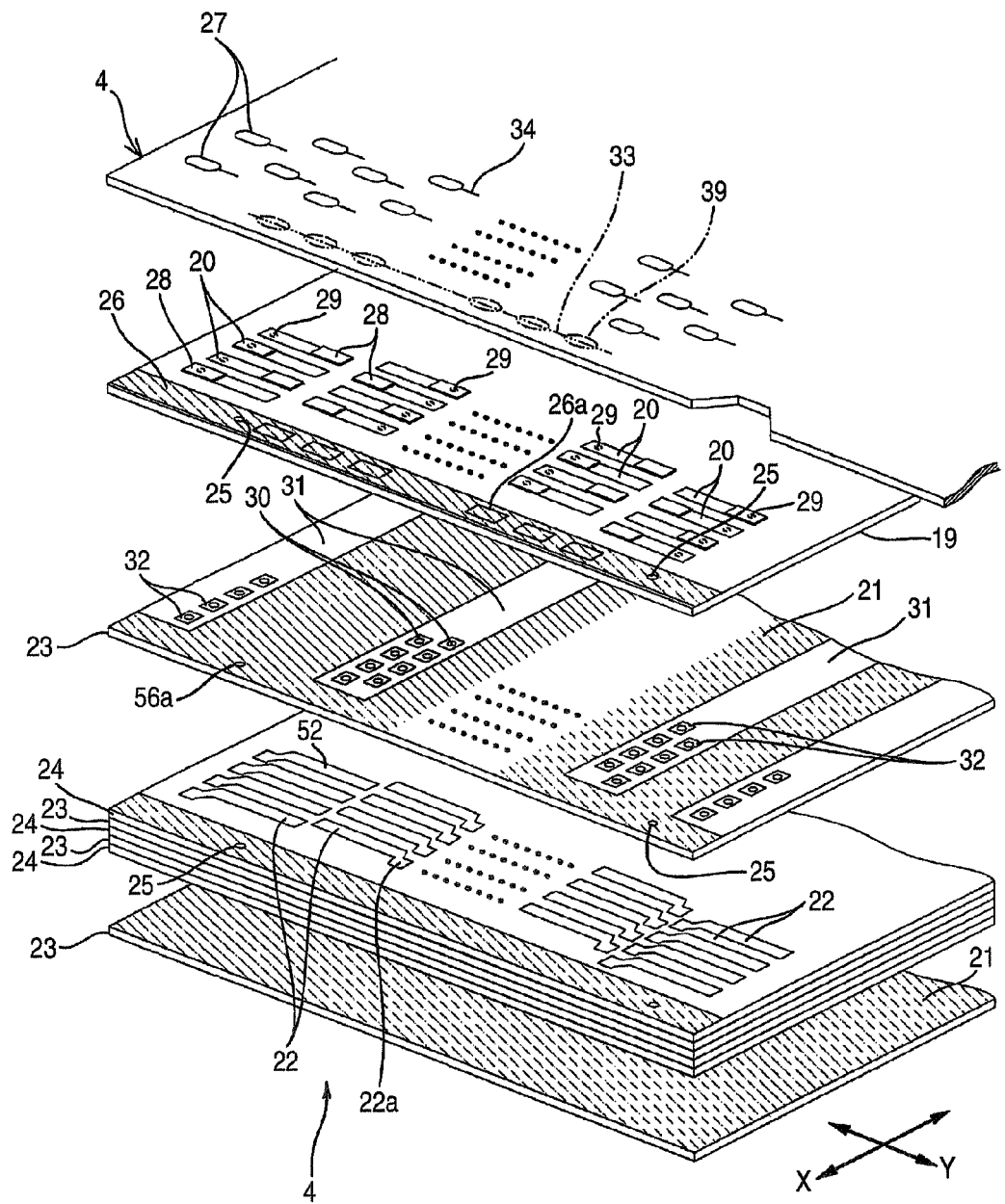
FIG. 3 is a disassembled perspective view of the piezoelectric actuator and a perspective view of a wiring member.

FIG. 3 is a disassembled perspective view of a piezoelectric actuator 1 and is a perspective view of a wiring member 4 bonded thereto. The piezoelectric actuator 1 includes: seven laminated piezoelectric layers 23 and 24 which have rectangle shapes and substantially the same dimensions in a plan view; an upper most piezoelectric layer 19 laminated on the uppermost part; surface individual electrodes 20 formed on the uppermost piezoelectric layers 19; a common electrode 20 provided between adjacent piezoelectric layers; and internal individual electrodes 22 (serving as internal electrodes) provided between adjacent piezoelectric layers. The piezoelectric actuator 1 is laminated and attached to the cavity unit 3 such that individual electrodes oppose the pressure chambers 13 of the cavity unit 3 with respect to the lamination direction.

The seven piezoelectric layers 23 and 24 include the first piezoelectric layers 23, 23 disposed at odd number layers when counted from below and the second piezoelectric layers 24, 24 disposed at even number layers when counted from below. The uppermost piezoelectric layer 19 is laminated on the upper surface of the uppermost one of the first piezoelectric layers 23. The pressure chambers 14 are covered by the underside of the piezoelectric actuator 1 (the lowermost one of the first piezoelectric layers 23) in a state where the piezoelectric actuator 1 is attached to the cavity unit 3.

The lowermost one of the first piezoelectric layers 23 has a common electrode 21 printed and formed on the entirety of the upper major surface thereof. Each of the first piezoelectric layers 23 other than the lowermost first piezoelectric layer 23 has a common electrode 21 and a non-electrode portion 31. The common electrode 21 is widely printed and formed on the upper surface of the first piezoelectric layer 23. The non-electrode portion 31 is defined at a portion where the common electrode 21 is not formed. Each of the second piezoelectric layers 24 has a plurality of internal individual electrodes 22 printed and formed on the upper surface thereof. Each of the internal individual electrodes 22 has a slender shape in the plan view such that the dimension in the lateral row direction (the Y-axis direction) is longer than the row direction (X-axis direction). The internal individual electrodes 22 formed on each of the second piezoelectric layers 24 are arranged in a row extending along the X-axis direction, and five rows of the internal individual electrodes 22 are arranged along the Y-axis direction, such that each of the internal individual electrodes 22 overlaps with corresponding one of the pressure chambers 14 with respect to the lamination direction. Each of the internal individual electrodes 22 includes a bent portion 22a that allows electrical connection to the outside of the second piezoelectric layer 24. On the upper surface of the uppermost piezoelectric layer 19, a surface common electrode 26 and a plurality of surface individual electrodes 20 are provided. The surface common electrode 26 allows electrical connections between the common electrodes 21 and the outside of the piezoelectric actuator 1 and has a band-shape extending in the Y-axis direction along the crosswise edge of the actuator. The plurality of surface individual electrodes 20 allow electrical connections between the internal individual electrodes 22 and the outside of the piezoelectric actuator 1. The surface individual electrodes 20 are arranged in a row, and a plurality of rows of the surface individual electrodes 20 are arranged in the Y-axis direction with predetermined intervals. Each of the surface individual electrodes 20 has a slender rectangular shape in plan view such that the dimension in the Y-axis direction is longer than the row direction (X-axis direction). When the rows are counted from one end in the Y-axis direction, even-numbered rows of the surface individual electrodes 20 are shifted from odd-numbered rows of the surface individual electrodes 20 in the X-axis direction. Each of the surface individual electrodes 20 includes an individual electrode terminal (electrode terminal) 28 provided at one end portion in the lengthwise direction of the surface individual electrode 20. The individual electrode terminal 28 is connectable to corresponding one of individual electrode lands (drive side terminal electrodes) exposed from the underside of the wiring member 4. The individual electrode terminal 28 has a slender rectangular shape smaller than the dimension in the lengthwise direction of the surface individual electrode 20. The plurality of electrode terminals 28 are disposed in the row direction (X-axis direction) and form a staggered pattern. A plurality of common electrode terminals 26a are disposed on the surface common electrode 26 with predetermined intervals in the Y-axis direction. The common electrode terminals 26a are provided to allow an electrical connection with the common electrode lands 39 of the wiring member 4. The individual electrode terminals 28 and the common electrode terminals 26a are provided for improving soldering connection with respective lands 27 and 39 of the wiring member 4. The surface electrodes 26 and 20 are formed by screen printing using an Ag—Pd based conductive material. The terminals 26a and 28 are printed and formed on the respective surface electrodes using an Ag-based conductive material including glass frit.

Common electrode through holes 25 each having circular shape in cross-section are formed in all the piezoelectric layers other than lowermost one of the first piezoelectric layers 23. The common electrode through holes 25 forms a hole penetrating in the lamination direction from the uppermost piezoelectric layer 19 and reaching the lowermost first piezoelectric layer 23. Relay wirings for common electrodes (not shown) are provided in the inside of the common electrode through holes 25. The relay wiring is formed by filling a conductive material in the common electrode through hole 25 or by coating the conductive material on the inner surface of the common electrode through hole 25. The common electrode through hole 25 is open at the position where the common surface electrode 26 of the upper surface of the uppermost piezoelectric layer 19 is provided.

Accordingly, the common electrodes 21 and the common surface electrode 26, which are arranged in the lamination direction, are electrically connected via the relay wirings for common electrodes. A band-shaped conductive material portion is provided on the upper surface of each of the second piezoelectric layers 24 in the vicinity of the positions where the common electrode through hole passes through, i.e., both end portions in the X-axis direction. Accordingly, the disconnection of the common electrode relay wiring on the second piezoelectric layers 24 is prevented.

In each of the first piezoelectric layers 23, 23, 23 up to the second ones from below, the common electrode 21 is provided on the upper surfaces thereof, and individual electrode through holes 30 (described later) are provided at the non-electrode portion 31. In the non-electrode portion 31, conductive material islands 32 are provided around the individual electrode through holes 30 and are independent from the common electrode 21. Therefore, the disconnection of the individual electrode relay wirings on the first piezoelectric layer 23 is prevented, and an electrical independency between the common electrode 21 and the internal individual electrodes 22 are maintained.

Figure 4:
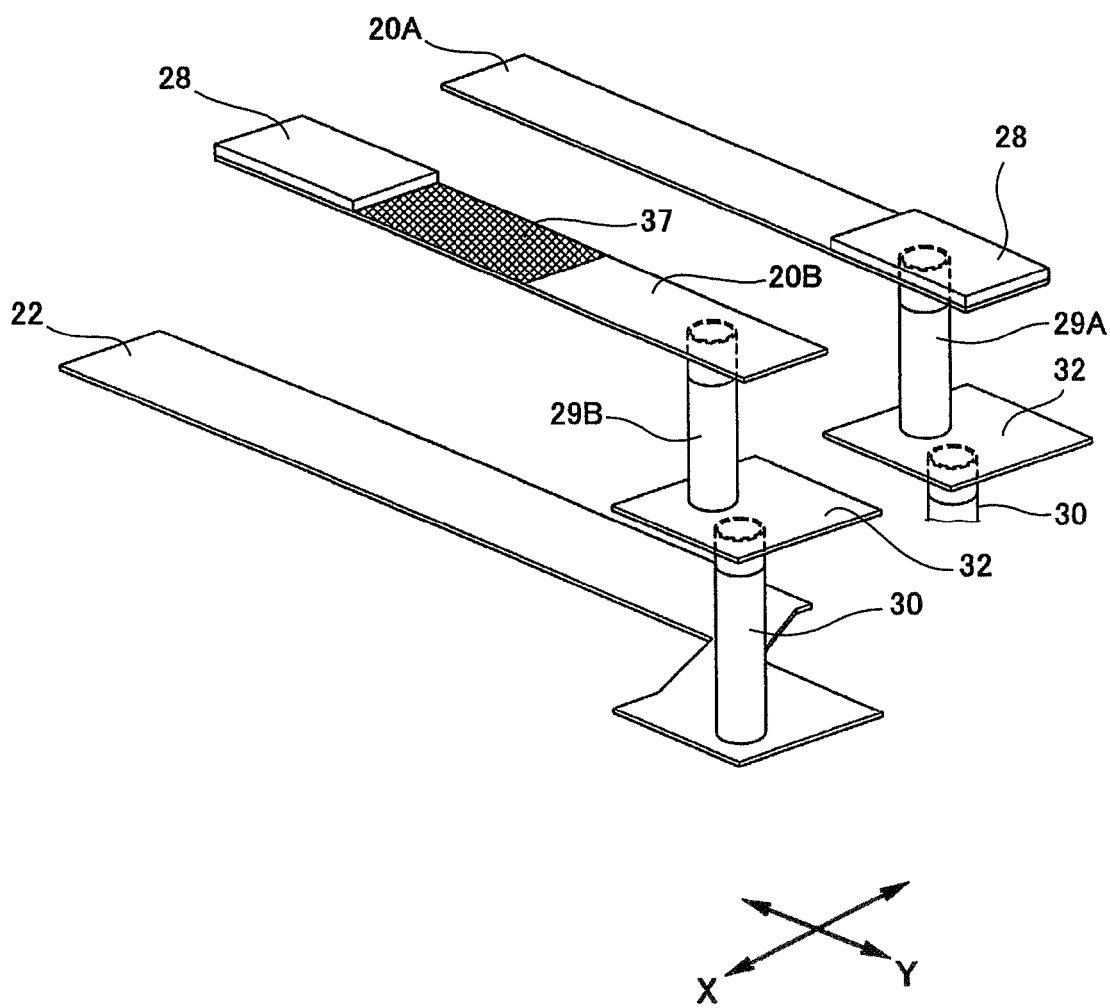
FIG. 4 is a schematic view describing a conduction path.

FIG. 4 is an enlarged disassembled view showing a state where the adjacent surface individual electrodes 20A and 20B in the X-axis direction of the uppermost piezoelectric layer 19 are connected with the internal individual electrodes 22 via the through holes. As shown in FIG. 4, surface layer through holes 29A and 29B having circular shapes in cross-section are formed to penetrate the piezoelectric layer 19 for the respective surface individual electrodes 20A and 20B (i.e., by the same number of the surface individual electrodes) to allow electrical connections between the surface individual electrodes 20A and 20B and the corresponding internal individual electrodes 22. The surface individual electrodes 20A and 20B are slender-shaped longer in the Y-axis direction and have individual electrode terminals 28 arranged in the X-axis direction and disposed in a staggered pattern alternately at one-end portions thereof. A surface layer through hole 29A corresponding to the surface individual electrode 20A of the two surface individual electrodes 20A and 20B adjacent to each other in the row direction (the X-axis direction) is positioned immediately below the individual electrode terminal 28. A surface layer through hole 29B corresponding to the other surface individual electrode 20B is formed immediately below the end portion opposite to the individual electrode terminal 28. Accordingly, a plurality of surface layer through holes 29A and 29B are formed substantially in a row along the longitudinal row direction (the X-axis direction) while being disposed at one-end side (at this side in FIG. 4) of the surface individual electrodes 20A and 20B.

In three first piezoelectric layers 23 from above and two second piezoelectric layers 24 from above, individual electrode through holes 30 for the internal individual electrodes are formed by the same quantity of the surface layer through holes 29A and 29B. Relay wirings for individual electrodes (not shown) are provided in the surface layer through holes 29A and 29B and the individual electrode through hole 30 by filling conductive materials therein or coating the conductive materials on the inner surfaces thereof. Therefore, the internal individual electrodes 22 are electrically connected to the respective surface individual electrodes 27 via the respective individual electrode through holes 30 and the respective surface layer through holes 29A and 29B. As shown in FIG. 4 and FIGS. 5A and 5B, a thickened portion 37 that extends in the lengthwise direction (the Y-axis direction) is disposed from the area where the corresponding electrode terminal 28 towards the opposite end is partially formed at the surface individual electrode 20B, which has the surface layer through hole 29B formed at the opposite end portion of the individual electrode terminal 28, of two surface individual electrodes 20A and 20B adjacent to each other in the row direction (the X-axis direction). The thickened portion 37 is formed by printing to be partially thick at a corresponding portion of the surface individual electrode. The thickened portion 37 may be formed on the surface individual electrode by other methods such as an evaporation method.

The wiring member 4 has one end portion connectable to the piezoelectric actuator 1 and the other end portion drawn out in the Y-axis direction. The wiring member 4 includes a flexible band-shaped resin sheet 35 and a protective material 36 which are laminated. The resin sheet 35 is made of synthetic resin such as polyamide, etc. The protective material is made of a synthetic resin material (polyamide resin and photosensitive solder resist, etc., and covers a conductive material made of a copper foil laminated on the underside of the resin sheet. A common electrode wiring 33, an individual electrode wiring 34, an individual electrode land (drive side terminal electrode) 27, and a common electrode land 39, etc., are formed on the underside of the resin sheet 35 by patterning using a photo-resist.

The common electrode wiring 33 is grounded and has a band-shape extending along the Y-axis direction to the other end portion of the wiring member 4 at both ends at the short side (both ends with respect to the X-axis direction) of the wiring member 4, and the common electrode wiring 33 is drawn out. The individual electrode lands 27 are formed at the positions corresponding to the individual electrode terminals 28 of the actuator 1, such that the individual electrode lands 27 are arranged in a staggered pattern in the X-axis direction and disposed in five rows that are arranged in the Y-axis direction. The common electrode lands 39 are formed at the positions corresponding to the common electrode terminals 26a on the common surface electrode 26. The individual electrode land 27 and the common electrode land 39 are opened to the actuator 1 side by etching or eliminating the protection material 36 by means of photo-resist, etc. The individual electrode wirings 34 extend from the respective individual electrode lands 27, pass between individual electrode lands adjacent in the Y-axis direction, and are connected to the drive circuit (not illustrated). The piezoelectric actuator 1 and the wiring member 4 are bonded by a conductive material 38 (a conductive bonding material having a thermal fusion property) such as solder. At first, the solder paste is applied at exposed portions formed by removing the protective material located at corresponding positions of the individual electrode lands 27 and the common electrode land 39, and bump electrodes are formed after a reflow process.

Thereafter, the wiring member 4 and the piezoelectric actuator 1 are aligned and laminated such that the individual electrode lands 27 and common electrode lands 39 having bump electrodes of solder 38 formed thereon oppose to the individual electrode terminals 28 and the common electrode terminals 26a provided on the surface individual electrode 20. In this state, the laminated wiring member 4 and piezoelectric actuator 1 are pressed and heated with a bar heater from above the wiring member 4, so that solder is melted. Accordingly, the wiring member 4 and the piezoelectric actuator 1 are electrically and mechanically connected to each other with the solder intervened between the lands 27 and 39 and the respective terminals. The piezoelectric actuator 1 and the wiring member 4 are position-aligned by a positioning device (not shown).

When the wiring member 4 and the actuator 1 are connected by solder, solder may overflow from between the respective lands and the respective terminals. In this case, overflowed excess solder spreads along the lengthwise direction (the Y-axis direction) of the surface individual electrode. The thickened portion 37 provided on the individual surface electrode is formed in areas where the excess solder (bump) 38 spreads along the lengthwise direction. In related art, disconnection of the surface individual electrodes occurs due to a silver corrosion crack of the surface individual electrodes by spread of the excess bump. However, in the illustrative aspect of the invention, even if silver of the surface individual electrode is diffused in the melted solder, the existence of the thickened portion 37 allows to reduce the possibility of the break of the surface individual electrodes, thereby any electrical disconnection is not likely to occur. Therefore, after the wiring member 4 is connected, even in the surface individual electrode 20B having one end portion connected to the surface layer through hole 29B and the other end portion opposite to the one end portion having the electrode terminal 28 formed thereon, it is possible to secure conductivity between the electrode terminal 28 and the surface layer through hole 29B since the wiring from the electrode terminals 28 to the surface layer through hole 29B is not disconnected. At the surface individual electrode 20B, voltage from the wiring member 4 is applied to the internal individual electrode 22, through the electrode terminal 28, surface individual electrode 20B, surface layer through hole 29B and individual electrode through hole 30. Incidentally, since the common electrode 21 is grounded, even if a silver corrosion crack occurs at the surface common electrode 26 caused by overflow of excess solder, electrical influence is small. Therefore, it is not necessary to provide the common electrode through holes 25 immediately below the common electrode terminals 26a.

Next, the outline of a method for manufacturing the piezoelectric actuator 1 will be described. At first, green sheets are prepared by: providing a mixed solution having titanic acid lead zirconate (PZT)-based ceramic powder having ferroelectricity, binder and solvent mixed therein as raw materials of the piezoelectric actuator 1; spreading the mixed solution to be sheeted; and drying the sheeted solution. On the major surface of the green sheets, electrodes such as internal individual electrodes and common electrodes to be formed on the piezoelectric layers and surface individual electrodes to be formed on the uppermost layer are formed by screen printing conductive materials (Silver palladium-based conductive paste). The green sheets are integrated by laminating and sintering the green sheets. The thickened portion 37 is formed by applying again a conductive material (Silver-Pd based) onto the corresponding surface individual electrodes 20 when forming the surface individual electrodes 20. After conductive materials (silver including glass frit) to be terminals are printed and formed at corresponding portions, terminals are formed on the respective surface electrodes by sintering the conductive materials at a lower temperature than the above-described sintering temperature. Thereafter, high voltage for polarization processing is applied between the internal individual electrodes 22 and the common electrodes 21, and a ceramic sheet placed between the electrodes 21 and 22 is processed for polarization and is given piezoelectric characteristics.

According to the above-described ink jet recording head 1, drive power output from the drive circuit is supplied to the internal individual electrodes 22 via the individual electrode terminals 28 and the individual electrode relay wirings. Since the common electrodes 21 are grounded, an area placed between the internal individual electrodes 22 and the common electrode 21 at the first and the second piezoelectric layers 23 and 24 is polarized and provides an activation portion that can have a piezoelectric effect. As the drive circuit selectively applies drive power to the internal individual electrodes 22 based on the printing data, the activation portions of the first and the second piezoelectric layers 23 and 24 corresponding thereto are elongated and deformed in the polarization direction. Accordingly, the internal capacity of the pressure chamber 14 overlapped on the internal individual electrodes 22 corresponding thereto in the lamination direction is decreased, thereby giving pressure to ink stored in the pressure chamber 14, and ink is ejected from the nozzle 17 as ink droplets to the outside of the cavity unit 3 via the communication flow path 16.

According to the piezoelectric actuator of the above-described illustrative aspects, an eight-layered structure is adopted by removing the adjustment layer of the related art piezoelectric actuator having a nine-layered structure. Therefore, the number of laminated piezoelectric layers is reduced, so that the manufacturing costs can be decreased. In addition, a possibility of disconnection of electrical and mechanical connections can be reduced. Further, as for the wiring member, a staggered pattern of the individual electrode lands can be adopted similar to the related art, so that the individual electrode lands can be arranged at a high density, and a plurality of wirings can be arranged between individual electrode lands adjacent thereto. Therefore, the channels can be multiplied and denser. The thickened portion 37 of the surface individual electrodes 20 can be easily formed in the manufacturing process by applying conductive paste two times.

In the illustrative aspect shown in FIGS. 5A and 5B, the thickened portion 37 extends near the edge of the surface individual electrode 20B towards the surface layer through hole 29B, and the entire area of individual electrode terminal 28 in plan view is formed on the thickened portion 37. However, the present invention is not limited thereto.

Figure 6:
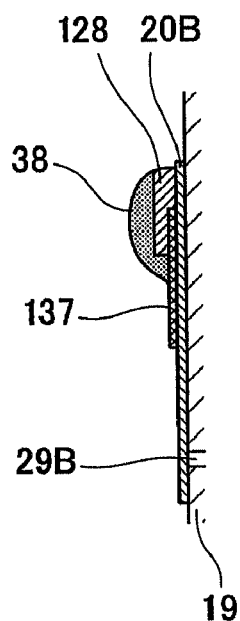
FIG. 6 is a cross-sectional view of the surface individual electrode according to another illustrative aspect of the invention.
Figure 7:
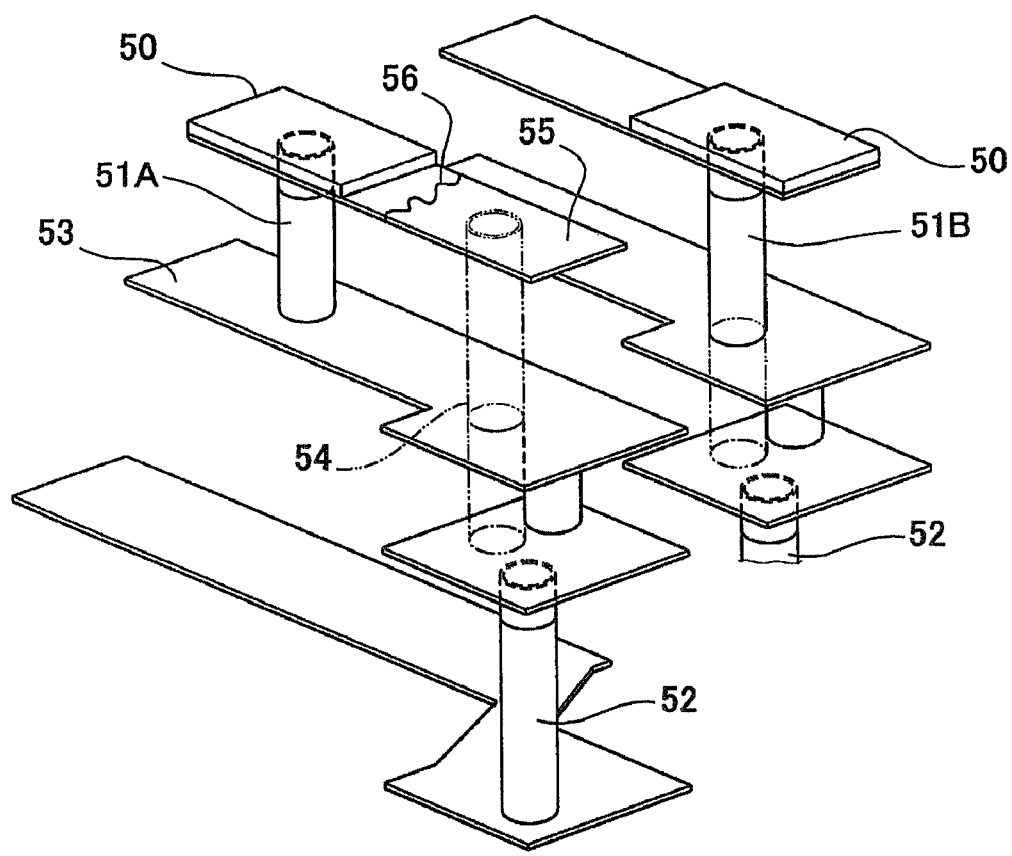
FIG. 7 is a schematic view describing a prior art conduction path.

FIG. 6 is a cross-sectional view of the surface individual electrode according to another illustrative aspect of the invention. As shown in FIG. 6, a thickened portion 137 is formed on the surface individual electrode 20B, such that an end of the thickened portion 137 opposite to the surface layer through hole 29B is located nearer to the surface layer through hole 29B than the thickened portion 37 of FIG. 5B. The individual electrode terminal 128 is formed on the surface individual electrode 20B and the surface individual electrode 20B at a portion uncovered with the thickened portion 37.

Accordingly, the enter area of the thickened portion may not be covered with the individual electrode terminal. The illustrative aspects of FIGS. 5B and 6 provide an overlapping region of the thickened portion and the individual electrode terminal in plan view. The overlapping region securely keeps the conductive material from entering into the space between the individual electrode terminal and the thickened portion thereby reduces the possibility of the disconnection between the individual electrode terminal and the surface layer through hole due to the spread of the conductive material. However, the thickened portion may not overlap with the individual electrode terminal in plan view.

The illustrative aspects disclosed above is only the example in all the aspects, and does not constitute any restriction. For example, the number of laminated layers of the piezoelectric actuator and the mode of the respective electrodes may be modified.

The present invention is applicable to a piezoelectric actuator, an ink jet recording head including the piezoelectric actuator, and a method for manufacturing the piezoelectric actuator.

What is claimed is:
1. A piezoelectric actuator comprising:
an uppermost piezoelectric layer comprising a plurality of surface individual electrodes provided on a front surface in a row that extends along a first direction, and the uppermost piezoelectric layer being connectable to a wiring member comprising a plurality of drive side terminal electrodes such that the surface individual electrodes are respectively connected to the drive side terminal electrodes;
a plurality of piezoelectric layers that are laminated and provided on a rear surface side of the uppermost piezoelectric layer; and
a plurality of internal electrodes disposed between the piezoelectric layers;
wherein each of the surface individual electrodes has a slender shape of which a longitudinal direction extends along a second direction perpendicular to the first direction;
wherein a plurality of surface layer through holes are formed in the uppermost piezoelectric layer such that the surface individual electrodes are connected to the internal electrodes via the surface layer through holes;
wherein an electrode terminal, which is smaller than a dimension of the respective surface individual electrodes in the longitudinal direction of the respective surface individual electrodes, is formed on each of the surface individual electrodes;
wherein the plurality of electrode terminals are disposed so as to be staggered along the first direction, and are connectable to the respective drive side terminal electrodes through a thermo-fusing conductive bonding material;
wherein the surface layer through holes are disposed substantially in a row that extends along the first direction; and wherein at least one of the plurality of surface individual electrodes has a thickened portion extending from the electrode terminal towards the surface layer through hole.

2. The piezoelectric actuator according to claim 1;
wherein the plurality of piezoelectric layers comprise a plurality of first piezoelectric layers and a plurality of second piezoelectric layers, the first piezoelectric layer and the second piezoelectric layer being alternately laminated;
wherein each of the first piezoelectric layers comprises internal individual electrodes as the internal electrodes formed on one major surface of the first piezoelectric layer, and each of the second piezoelectric layers has a common electrode on one major surface of the second piezoelectric layer, such that activation portions are defined at overlapped portions between the internal individual electrodes and the common electrode with respect to a lamination direction;
wherein the internal individual electrodes of one first piezoelectric layer and another first piezoelectric layer are electrically connected in the lamination direction via through holes;
wherein the common electrodes of one second piezoelectric layer and another second piezoelectric layer are electrically connected in the lamination direction via through holes;
wherein the second piezoelectric layer includes an uppermost second piezoelectric layer provided adjacent to the uppermost piezoelectric layer with respect to the lamination direction, and the uppermost second piezoelectric layer has a plurality of internal individual electrode through holes arranged substantially in a row along the first direction at positions corresponding to the surface layer through holes; and
wherein one of the first piezoelectric layers is provided adjacent to the uppermost second piezoelectric layer with respect to the lamination direction and having the internal individual electrodes electrically connected to the respective surface individual electrodes via the respective internal individual electrode through holes and the respective surface layer through holes.

3. The piezoelectric actuator according to claim 1;
wherein one of the surface layer through holes corresponding to one of adjacent two surface individual electrodes in the first direction is formed immediately below the electrode terminal, and one of the surface layer through holes corresponding to the other of the adjacent two surface individual electrodes is formed immediately below an end portion opposite to the electrode terminal.

4. The piezoelectric actuator according to claim 3;
wherein the thickened portion is formed only at the other of surface individual electrode and extends in the longitudinal direction from the electrode terminal.

5. A liquid ejection head comprising:
a cavity unit comprising nozzles arranged in a row and a plurality of pressure chambers arranged in a row corresponding to the respective nozzles; and
a piezoelectric actuator attached to the cavity unit such that activation portions correspond to the respective pressure chambers;
wherein the piezoelectric actuator comprises:
an uppermost piezoelectric layer comprising a plurality of surface individual electrodes provided on a front surface in a row that extends along a first direction, and the uppermost piezoelectric layer being connectable to a wiring member comprising a plurality of drive side terminal electrodes such that the surface individual electrodes are respectively connected to the drive side terminal electrodes;
a plurality of piezoelectric layers that are laminated and provided on a rear surface side of the uppermost piezoelectric layer; and
a plurality of internal electrodes disposed between the piezoelectric layers;
wherein each of the surface individual electrodes has a slender shape of which a longitudinal direction extends along a second direction perpendicular to the first direction;
wherein a plurality of surface layer through holes are formed in the uppermost piezoelectric layer such that the surface individual electrodes are connected to the internal electrodes via the surface layer through holes;
wherein an electrode terminal, which is smaller than a dimension of the respective surface individual electrodes in the longitudinal direction of the respective surface individual electrodes, is formed in one end portion of each of the surface individual electrodes;
wherein the plurality of electrode terminals are disposed so as to be staggered along the first, and are connectable to the respective drive side terminal electrodes through a thermo-fusing conductive bonding material;
wherein the surface layer through holes are disposed substantially in a row that extends along the first direction; and
wherein at least one of the plurality of surface individual electrodes has a thickened portion extending from the electrode terminal towards the surface layer through hole.

6. A method for manufacturing a piezoelectric actuator comprising: an uppermost piezoelectric layer comprising a plurality of surface individual electrodes provided on a front surface in a row that extends along a first direction, and the uppermost piezoelectric layer being connectable to a wiring member comprising a plurality of drive side terminal electrodes such that the surface individual electrodes are respectively connected to the drive side terminal electrodes; a plurality of piezoelectric layers that are laminated and provided on a rear surface side of the uppermost piezoelectric layer; and a plurality of internal electrodes disposed between the piezoelectric layers, said method comprising:
forming a plurality of surface layer through holes in the uppermost piezoelectric layer to be arranged substantially in a row extending along the first direction, such that the surface individual electrodes are connected to the internal electrodes via the surface layer through holes;
forming the individual electrodes on the uppermost piezoelectric layer such that the surface individual electrodes has a slender shape of which a longitudinal direction extends along a second direction perpendicular to the first direction;
applying a conductive paste on the surface individual electrodes to form electrode terminals which are each smaller than a dimension of the respective surface individual electrodes in the longitudinal direction of the respective surface individual electrodes, such that the plurality of electrode terminals are disposed along the first direction to be staggered and are connectable to the respective drive side terminal electrodes through a bonding material made of the conductive paste;

applying a conductive paste again on at least a part of the individual electrodes to form a thickened portion extending from the electrode terminal towards the surface layer through hole.

7. A piezoelectric actuator comprising:

a plurality of piezoelectric layers laminated in a lamination direction, the piezoelectric layers including an outermost piezoelectric layer which is disposed at an outermost location of the piezoelectric layers with respect to the lamination direction, where the outermost piezoelectric layer has a first surface, and a second surface that is opposite to the first surface and faces another piezoelectric layer; and a plurality of individual electrodes formed on the first surface of the outermost piezoelectric layer and arranged in a row extending along a first direction, each of the plurality of individual electrodes having a first end portion and a second end portion opposite to the first end portion with respect to a second direction perpendicular to the first direction;

wherein a plurality of through holes are formed in the outermost piezoelectric layer and arranged substantially in a row extending in the first direction, and the through holes respectively contact with the first end portions of the individual electrodes;

wherein the individual electrodes comprise at least one first individual electrode and at least one second individual electrode, the first individual electrode comprises a first electrode terminal provided at the first end portion, and the second individual electrode comprises a second electrode terminal provided at the second end portion; and wherein the second individual electrode has a thickened portion extending from the second electrode terminal towards the first end portion.

8. The piezoelectric actuator according to claim 7;

wherein the first electrode terminal is located immediately above the through hole.

* * * * *